(12) United States Patent
Kimura et al.

(10) Patent No.: US 11,239,057 B2
(45) Date of Patent: Feb. 1, 2022

(54) SHOWERHEAD AND METHOD FOR MANUFACTURING THE SAME

(71) Applicant: Sumitomo Electric Industries, Ltd., Osaka (JP)

(72) Inventors: Koichi Kimura, Itami (JP); Akira Mikumo, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 121 days.

(21) Appl. No.: 16/633,651

(22) PCT Filed: Jun. 25, 2018

(86) PCT No.: PCT/JP2018/023937
§ 371 (c)(1),
(2) Date: Jan. 24, 2020

(87) PCT Pub. No.: WO2019/021713
PCT Pub. Date: Jan. 31, 2019

(65) Prior Publication Data
US 2020/0168435 A1    May 28, 2020

(30) Foreign Application Priority Data
Jul. 28, 2017    (JP) .............................. JP2017-146192

(51) Int. Cl.
*C23C 16/40*    (2006.01)
*H01J 37/32*    (2006.01)
*C23C 16/455*    (2006.01)

(52) U.S. Cl.
CPC .... *H01J 37/3244* (2013.01); *C23C 16/45565* (2013.01)

(58) Field of Classification Search
CPC ........... H01J 37/3244; C23C 16/45565; C23C 16/505; H01L 21/3065; H01L 21/205
(Continued)

(56) References Cited

U.S. PATENT DOCUMENTS 4,657,616 A * 4/1987 Benzing .................... B08B 7/00
                                                         118/50.1
5,549,780 A * 8/1996 Koinuma ................ B29C 59/14
                                                         156/345.39
(Continued)

FOREIGN PATENT DOCUMENTS

JP    2008-294017 A    12/2008
JP    2013-143512 A    7/2013
(Continued)

*Primary Examiner* — Rudy Zervigon
(74) *Attorney, Agent, or Firm* — Faegre Drinker Biddle & Reath LLP

(57) ABSTRACT

A showerhead provided in a chamber of a semiconductor manufacturing apparatus and facing a wafer holder includes: a disk-shaped member having a plurality of through holes penetrating the disk-shaped member in a direction of a thickness thereof; a high-frequency conductor embedded in the disk-shaped member; a hole provided in the disk-shaped member, extending in the direction of the thickness of the disk-shaped member and having a bottom exposing a portion of the conductor; an electrode terminal portion disposed in the hole and having a base portion electrically connected to the conductor and a columnar portion provided on the base portion; a cylindrical member having a first end portion fitted outside the columnar portion and facing the conductor and a second end portion facing away from the first end portion, and a sealing member surrounding the first end portion.

9 Claims, 4 Drawing Sheets

(58) Field of Classification Search
USPC ....... 118/723 E; 156/345.43, 345.44, 345.45, 156/345.46, 345.47
See application file for complete search history.

(56) References Cited

U.S. PATENT DOCUMENTS

| | | | | |
|---|---|---|---|---|
| 6,108,189 | A * | 8/2000 | Weldon | C23C 16/4586 279/128 |
| 6,441,553 | B1 * | 8/2002 | Yializis | H01J 37/3244 315/111.21 |
| 6,460,482 | B1 * | 10/2002 | Kuibira | C23C 16/455 118/723 R |
| 6,623,596 | B1 * | 9/2003 | Collins | A21D 2/185 118/723 E |
| 6,764,658 | B2 * | 7/2004 | Denes | B29C 59/14 118/723 E |
| 7,196,283 | B2 * | 3/2007 | Buchberger, Jr. | H01J 37/32091 219/121.43 |
| 7,345,342 | B2 * | 3/2008 | Challa | H01L 29/0634 257/341 |
| 7,543,546 | B2 * | 6/2009 | Shibata | H01J 37/32009 118/723 E |
| 7,827,657 | B2 * | 11/2010 | Kennedy | H01J 37/3244 29/20 |
| 7,976,674 | B2 * | 7/2011 | Brcka | H01J 37/32568 156/345.48 |
| 8,994,270 | B2 * | 3/2015 | Koo | H01J 37/32577 315/111.21 |
| 9,157,152 | B2 * | 10/2015 | Faguet | C23C 16/452 |
| 9,685,305 | B2 * | 6/2017 | Maruyama | H01L 21/67069 |
| 9,934,944 | B2 * | 4/2018 | Akita | A61L 9/22 |
| 10,522,332 | B2 * | 12/2019 | Lee | H01J 37/3233 |
| 10,879,042 | B2 * | 12/2020 | Subramani | H01J 37/3244 |
| 10,886,157 | B2 * | 1/2021 | Kimura | C23C 16/46 |
| 2003/0000924 | A1 * | 1/2003 | Strang | H01J 37/3244 216/86 |
| 2003/0129107 | A1 * | 7/2003 | Denes | H01J 37/32532 422/186.21 |
| 2003/0205202 | A1 * | 11/2003 | Funaki | C23C 16/54 118/723 E |
| 2005/0001527 | A1 * | 1/2005 | Sugiyama | H01J 37/32082 313/231.31 |
| 2005/0178748 | A1 * | 8/2005 | Buchberger, Jr. | H01J 37/32183 219/121.48 |
| 2006/0042545 | A1 * | 3/2006 | Shibata | H01J 37/32357 118/722 |
| 2007/0037408 | A1 * | 2/2007 | Tachibana | C23C 16/515 438/778 |
| 2009/0218212 | A1 * | 9/2009 | Denpoh | C23C 16/50 204/164 |
| 2010/0037820 | A1 * | 2/2010 | Lee | C23C 16/45551 118/719 |
| 2011/0101862 | A1 * | 5/2011 | Koo | H01J 37/32449 315/111.21 |
| 2011/0180213 | A1 * | 7/2011 | Hirayama | H01J 37/32449 156/345.33 |
| 2013/0180662 | A1 | 7/2013 | Sato et al. | |
| 2014/0139049 | A1 * | 5/2014 | Fischer | H01J 37/32541 307/149 |
| 2015/0040829 | A1 * | 2/2015 | Ramaswamy | H01J 37/32596 118/723 E |
| 2015/0200076 | A1 * | 7/2015 | Koo | H05H 1/2406 315/111.21 |
| 2016/0163515 | A1 * | 6/2016 | Maruyama | H01J 37/32816 438/714 |
| 2017/0032935 | A1 | 2/2017 | Benjamin et al. | |
| 2017/0213701 | A1 * | 7/2017 | Subramani | C23C 16/50 |
| 2017/0232483 | A1 * | 8/2017 | Swanson | B08B 7/0035 134/1.1 |
| 2018/0130679 | A1 * | 5/2018 | Weng | H01J 37/3244 |
| 2018/0174878 | A1 * | 6/2018 | Kimura | C23C 16/509 |
| 2018/0330927 | A1 * | 11/2018 | Bera | C23C 16/4584 |
| 2020/0168435 | A1 * | 5/2020 | Kimura | C23C 16/45565 |
| 2021/0210312 | A1 * | 7/2021 | Subramani | H01J 37/3244 |

FOREIGN PATENT DOCUMENTS

| | | |
|---|---|---|
| JP | 2016-122724 A | 7/2016 |
| JP | 2017-22284 A | 1/2017 |

* cited by examiner

1

SHOWERHEAD AND METHOD FOR MANUFACTURING THE SAME

TECHNICAL FIELD

The present disclosure relates to a showerhead and a method for manufacturing the same. The present application claims priority based on Japanese Patent Application No. 2017-146192 filed on Jul. 28, 2017, and incorporates herein all the contents described in the Japanese Patent Application.

BACKGROUND ART

In semiconductor manufacturing apparatuses for manufacturing semiconductor devices such as LSIs, a semiconductor wafer is placed on a wafer holder, also referred to as a susceptor, introduced in a chamber, and, while having a back surface heated, has a front surface subjected to a variety of types of thin film processing such as CVD, sputtering and other deposition processes, etching, and the like. Such thin film processing may be performed in a plasma atmosphere, and a semiconductor manufacturing apparatus used in that case is provided with radio frequency (RF) electrodes, with one (or a lower) electrode embedded in the wafer holder and the other (or an upper) electrode above the wafer holder to face the lower electrode. By applying radio frequency (RF) voltage between the electrodes, a source gas present between the electrodes can be made into a plasma state.

In the chamber of the above semiconductor manufacturing apparatus, a showerhead is provided above the wafer holder in order to introduce the source gas. The showerhead generally has a portion facing a wafer carrying surface of the wafer holder and having a disk-shaped member provided with a large number of gas discharging holes so that the source gas can be uniformly supplied toward the wafer carrying surface of the wafer holder. Embedding a conductive member in the disk-shaped member for a radio frequency electrode allows the showerhead to also serve as the upper electrode. For example, PTL 1 discloses that an upper electrode circuit for generating a radio frequency wave is embedded in a ceramic plate for a showerhead having a plurality of gas discharging holes and a metal support holding the ceramic plate and the upper electrode circuit are electrically connected by using a spring.

CITATION LIST

Patent Literature

PTL1: Japanese Patent Laying-Open No. 2008-294017

SUMMARY OF INVENTION

A showerhead of the present disclosure is a showerhead provided in a chamber of a semiconductor manufacturing apparatus and facing a wafer holder, and includes: a disk-shaped member having a plurality of through holes penetrating the disk-shaped member in a direction of a thickness thereof; a high-frequency conductor embedded in the disk-shaped member; a hole provided in the disk-shaped member, extending in the direction of the thickness of the disk-shaped member and having a bottom exposing a portion of the conductor; an electrode terminal portion disposed in the hole and having a base portion electrically connected to the conductor and a columnar portion provided on the base portion; a cylindrical member having a first end portion fitted outside the columnar portion and facing the conductor and a second end portion facing away from the first end portion, the second end portion's outer diameter being smaller than the first end portion's outer diameter, the second end portion's inner diameter being larger than the first end portion's inner diameter; and a sealing member surrounding the first end portion.

According to the present disclosure, a method for manufacturing a showerhead comprises: forming a hole in a disk-shaped member, which has a high-frequency conductor embedded therein, in a direction of a thickness of the disk-shaped member to expose a portion of the conductor; connecting an electrode terminal portion to the conductor exposed at a bottom of the hole; fitting a glass preform in a form of a doughnut to the electrode terminal portion; fitting to the electrode terminal portion a cylindrical member having a first end portion facing the conductor and a second end portion facing away from the first end portion, the second end portion's outer diameter being smaller than the first end portion's outer diameter, the second end portion's inner diameter being larger than the first end portion's inner diameter; fusing the glass preform; pressing the cylindrical member toward the conductor until the fused glass preform protrudes into a gap between the diameter-reduced portion and an inner wall of the hole and a gap between the diameter-increased portion and an outer peripheral surface of the electrode terminal portion; and solidifying the fused glass preform to seal the cylindrical member.

DETAILED DESCRIPTION

Figure 1A:
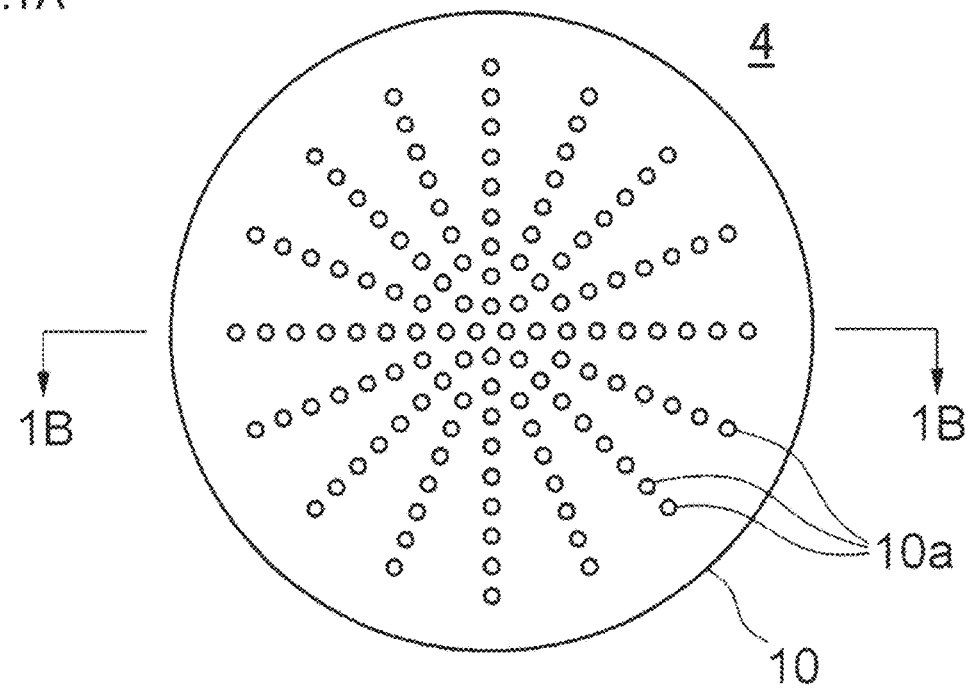
FIG. 1A is a schematic plan view of a showerhead according to an embodiment.

Problem to be Solved by the Present Disclosure

As has been set forth above, when the upper electrode is embedded in the disk-shaped member of the showerhead, the disk-shaped member is provided with a hole in a surface thereof facing away from a surface thereof facing the wafer holder and an electrode terminal portion is connected to the upper electrode exposed at the bottom of the hole to feed the upper electrode with power. However, the chamber has an internal atmosphere in a corrosive environment, and a connection portion between the upper electrode and the electrode terminal portion may provide poor connection due to corrosion.

The present disclosure has been made in view of such a conventional situation, and contemplates a showerhead having a sealing structure in which an electrical connection portion between a conductor such as an upper electrode embedded in a disk-shaped member of the showerhead and an electrode terminal portion for feeding the conductor with power is less likely to provide poor connection.

Advantageous Effect of the Present Disclosure

According to the present disclosure, poor connection of the electrical connection portion between the upper electrode and the electrode terminal portion for feeding the upper electrode with power is less likely to occur.

Initially, embodiments of the present disclosure will be enumerated and specifically described. A showerhead according to an embodiment is a showerhead provided in a chamber of a semiconductor manufacturing apparatus and facing a wafer holder, and includes: a disk-shaped member having a plurality of through holes penetrating the disk-shaped member in a direction of a thickness thereof; a high-frequency conductor embedded in the disk-shaped member; a hole provided in the disk-shaped member, extending in the direction of the thickness of the disk-shaped member and having a bottom exposing a portion of the conductor; an electrode terminal portion disposed in the hole and having a base portion electrically connected to the conductor and a columnar portion provided on the base portion; a cylindrical member having a first end portion fitted outside the columnar portion and facing the conductor and a second end portion facing away from the first end portion, the second end portion's outer diameter being smaller than the first end portion's outer diameter, the second end portion's inner diameter being larger than the first end portion's inner diameter; and a sealing member surrounding the first end portion. Thus, poor connection of the electrical connection portion between the upper electrode and a terminal portion for feeding the upper electrode with power is less likely to occur.

In the above embodiment, the showerhead may further have a connection portion that is disposed in the hole and electrically connects the conductor and the base portion. Furthermore, the base portion may have a flange portion facing the conductor. A larger electrical connection portion can be obtained and in addition, the electrode terminal portion can be more firmly fixed.

Furthermore, the cylindrical member may cover at least a portion of an upper surface of the flange portion by the first end portion. As a result, the electrode terminal portion can be more reliably fixed, and an electrical connection portion between the conductor and the electrode terminal portion can be more reliably sealed. Furthermore, the connection portion may include a conductive annular member and may include a conductive member in the form of a hollowed conical frustum increased in diameter in a direction from the conductor toward the base portion. This allows more reliable electrical connection.

Furthermore, in the above embodiment, the sealing member may fill a gap formed between the cylindrical member and the electrode terminal portion and a gap formed between the cylindrical member and the hole. Reliable sealing can be provided on a side radially inner than the cylindrical member and a side radially outer than the cylindrical member and in addition, on the side radially outer than the cylindrical member, a plane parallel to the direction of the thickness of the gas discharging portion and a plane perpendicular to the direction of the thickness of the gas discharging portion can both be sealed, and sealability can thus be enhanced. Furthermore, the cylindrical member may be made of aluminum nitride, and the sealing member may be made of glass. This can further enhance the corrosion resistance of the connection portion between the conductor and the electrode terminal portion.

According to an embodiment, a method for manufacturing a showerhead comprises: forming a hole in a disk-shaped member, which has a high-frequency conductor embedded therein, in a direction of a thickness of the disk-shaped member to expose a portion of the conductor; connecting an electrode terminal portion to the conductor exposed at a bottom of the hole; fitting a glass preform in a form of a doughnut to the electrode terminal portion; fitting to the electrode terminal portion a cylindrical member having a first end portion facing the conductor and a second end portion facing away from the first end portion, the second end portion's outer diameter being smaller than the first end portion's outer diameter, the second end portion's inner diameter being larger than the first end portion's inner diameter; fusing the glass preform; pressing the cylindrical member toward the conductor until the fused glass preform protrudes into a gap between the diameter-reduced portion and an inner wall of the hole and a gap between the diameter-increased portion and an outer peripheral surface of the electrode terminal portion; and solidifying the fused glass preform to seal the cylindrical member. This can stably seal the electrical connection portion between the upper electrode and the electrode terminal portion for feeding the upper electrode with power.

Figure 1B:
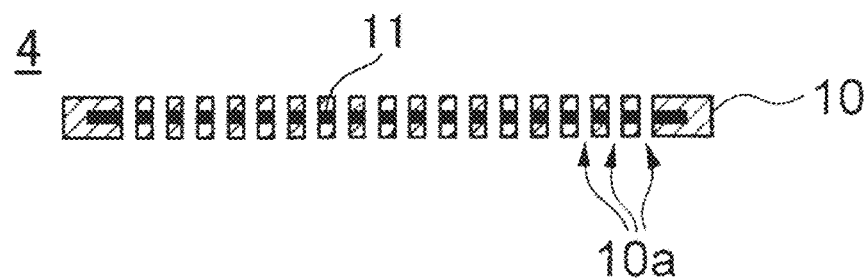
FIG. 1B is a cross section taken along a line 1B-1B indicated in FIG. 1A.
Figure 6:
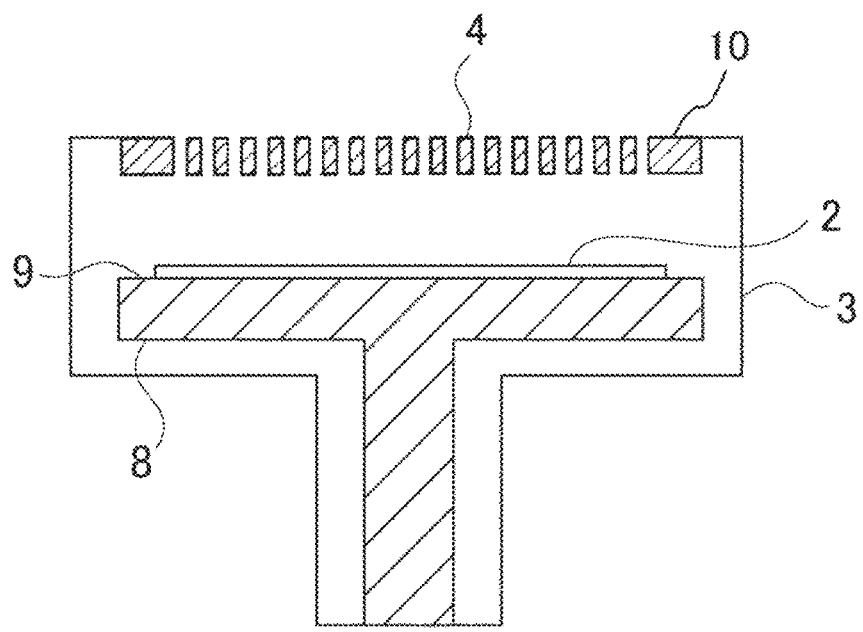
FIG. 6 is a schematic cross section of a semiconductor manufacturing apparatus.

Hereinafter reference will be made to the drawings to describe an embodiment of a showerhead according to the present disclosure. With reference to FIG. 6, a showerhead 4 is provided in a chamber 3, in which a semiconductor wafer 2 to be processed is subjected to thin film processing such as plasma CVD in a plasma atmosphere, above a wafer holder 8 holding and heating semiconductor wafer 2. As shown in FIGS. 1A and 1B, showerhead 4 has a disk-shaped member 10 serving as a gas discharging portion having a thickness of about 3.0 to 10.0 mm and an outer diameter of about 300 to 400 mm. Showerhead 4 has at an end thereof facing wafer holder 8 a gas discharging portion having gas discharging holes 10a which are a plurality of through holes provided through disk-shaped member 10. With reference to FIGS. 1A and 1B, showerhead 4 has disk-shaped member 10 having a thickness of about 3.0 to 10.0 mm and an outer diameter of about 300 to 400 mm for discharging a gas as a source for a plasma toward wafer holder 8. Disk-shaped member 10 has a plurality of gas discharging holes 10a having an inner diameter of about 0.1 to 5.0 mm. The plurality of gas discharging holes 10a are provided in a concentric, radial or similar pattern for example.

Showerhead 4 is provided so as to face a wafer carrying surface 9 of wafer holder 8 in parallel. This allows a plasma generating source gas to be supplied uniformly toward wafer carrying surface 9. Disk-shaped member 10 is formed of a ceramic material such as aluminum nitride, silicon nitride, silicon carbide, aluminum oxide, and so forth to ensure electrical insulation for a conductor 11, as will be described hereinafter. Inter alia, aluminum nitride is preferable as it has high thermal conductivity and also has excellent corrosion resistance.

Inside disk-shaped member 10, conductor 11 for the upper electrode is embedded for example in the form of a generally circular thin film. Conductor 11 may be formed of any material insofar as it is electrically conductive. The conductor may be formed for example of metal foil such as stainless steel foil or by screen-printing and firing a paste containing tungsten or similar metal powder. Disk-shaped member 10 has gas discharging holes 10a penetrating disk-shaped member 10 in the direction of the thickness thereof, and accordingly, conductor 11 is provided with an opening at a position corresponding to each gas discharging hole 10a.

Figure 2:
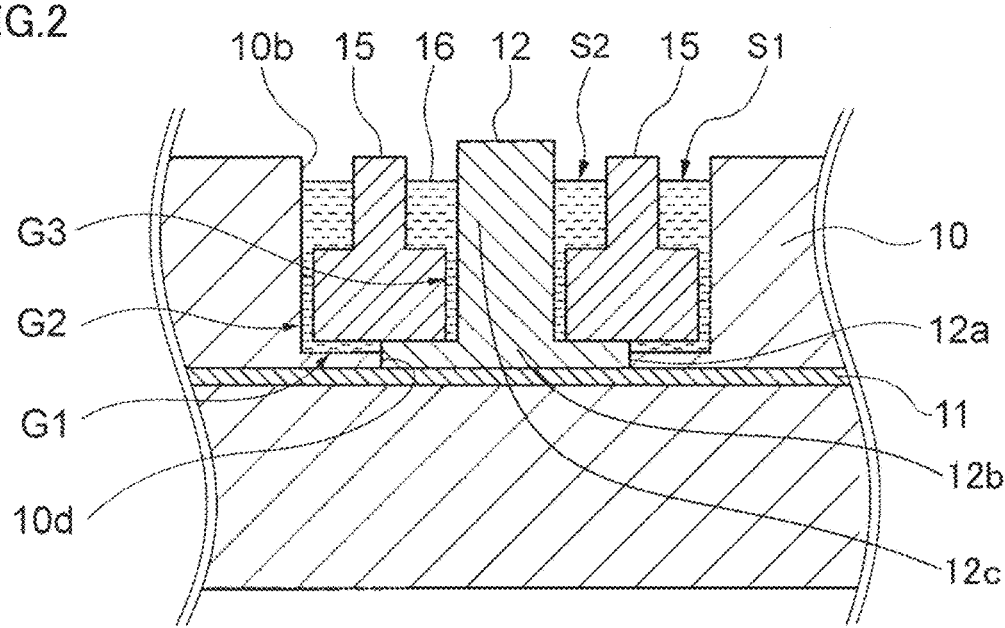
FIG. 2 is a partial cross section of a first specific example of a showered according to an embodiment.

Referring to FIG. 2, in order to feed conductor 11 with power, one or more circular holes 10b having an inner diameter of about 5 to 20 mm are provided in a peripheral portion of disk-shaped member 10. An electrode terminal portion 12 having an outer diameter of about 1.5 to 10 mm is connected to conductor 11 partially exposed from the bottom of hole 10b. By connecting a lead wire (not shown) that is connected to electrode terminal portion 12 to an output terminal (not shown) of a power supply, conductor 11 can be fed with power. Electrode terminal portion 12 is provided at the peripheral portion of disk-shaped member 10 because electrode terminal portion 12 provided at a central portion of disk-shaped member 10 would prevent that portion from having gas discharging hole 10a and hence prevent a gas from being uniformly discharged.

A specific example of a structure of the connection portion between conductor 11 and electrode terminal portion 12 will be described in detail with reference to FIG. 2. Hole 10b that is circular in a plan view is provided in disk-shaped member 10 at a surface facing away from that facing wafer holder 8. Hole 10b has a depth that reaches conductor 11. Therefore, conductor 11 is partially exposed from the bottom of hole 10b. For example, electrode terminal portion 12 made of tungsten is directly connected to the exposed portion.

Electrode terminal portion 12 may have a general, substantially columnar shape. However, in a first specific example shown in FIG. 2, a base portion 12b is provided at an end portion on a side connected to conductor 11. A columnar portion 12c is provided on base portion 12b. A flange portion 12a surrounds base portion 12b. Base portion 12b and flange portion 12a have a lower surface directly connected to conductor 11. This ensures a larger area for electrical connection with conductor 11.

Figure 3A:
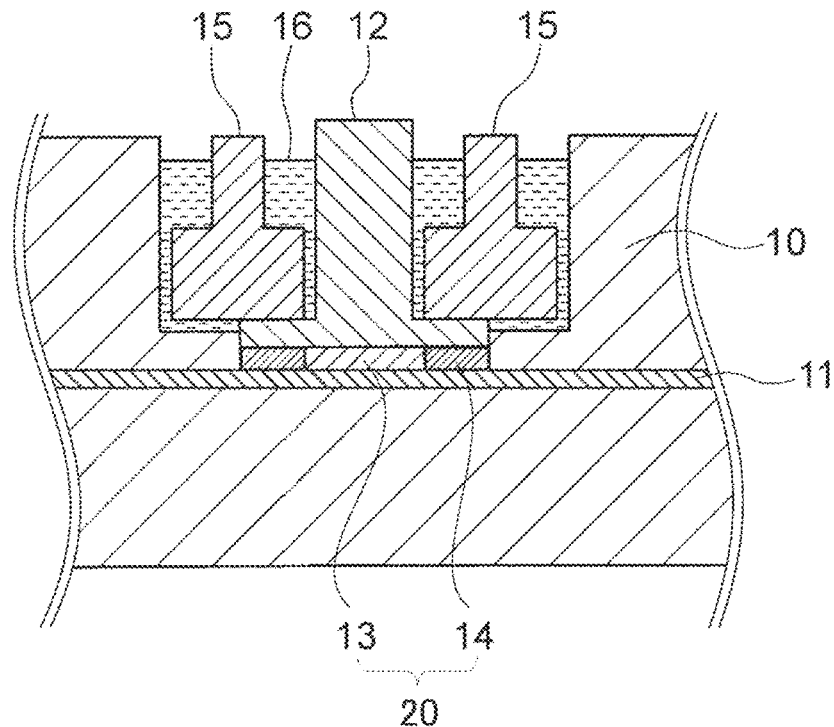
FIG. 3A is a partial cross section of a second specific example of a showered according to an embodiment.

Instead of the structure in which base portion 12b and flange portion 12a are directly connected to conductor 11, a second specific example is shown in FIG. 3A. In this example, an annular member 14 made for example of tungsten and having an outer diameter substantially equal to that of flange portion 12a is used to connect to conductor 11. A plate-shaped member 13 is disposed inside annular member 14. Plate-shaped member 13 is preferably made of the same material as disk-shaped member 10, i.e., ceramic. Plate-shaped member 13 and annular member 14 constitute connection portion 20. Annular member 14 can be formed for example by printing and firing a paste containing tungsten or similar metal powder on the outer peripheral surface of plate-shaped member 13. Annular member 14 may be a member of metal such as tungsten formed in an annular shape in advance.

Figure 3B:
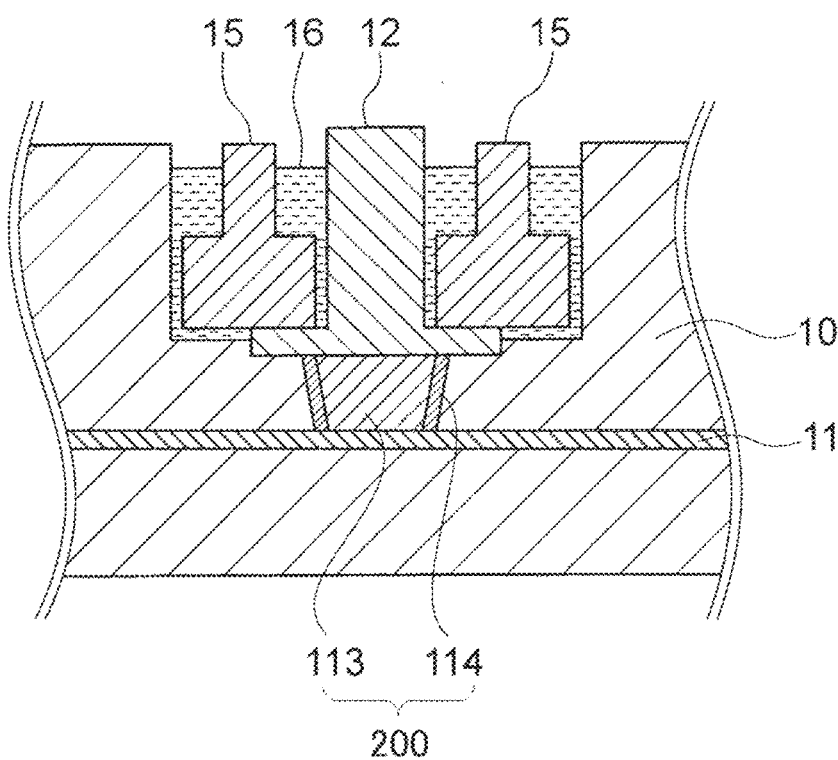
FIG. 3B is a partial cross section of a third specific example of a showered according to an embodiment.

A third specific example is shown in FIG. 3B. In this example, a member 114 of tungsten in the form of a hollowed conical frustum having a tapered structure having a diameter gradually decreased as it approaches conductor 11 is used to connect to conductor 11. Inside member 114 in the form of the hollowed conical frustum is disposed a truncated conical member 113. Member 114 in the form of the hollowed conical frustum is preferably made of the same material as disk-shaped member 10, i.e., ceramic. Truncated conical member 113 and member 114 in the form of the hollowed conical frustum constitute connection portion 200. Member 114 in the form of the hollowed conical frustum can be formed for example by printing and firing a paste containing tungsten or similar metal powder on the outer peripheral surface of truncated conical member 113. Member 114 in the form of the hollowed conical frustum may be a member of metal such as tungsten formed in a hollowed shape in advance. The configuration shown in FIG. 3A or 3B more reliably provide electrical connection.

Figure 4A:
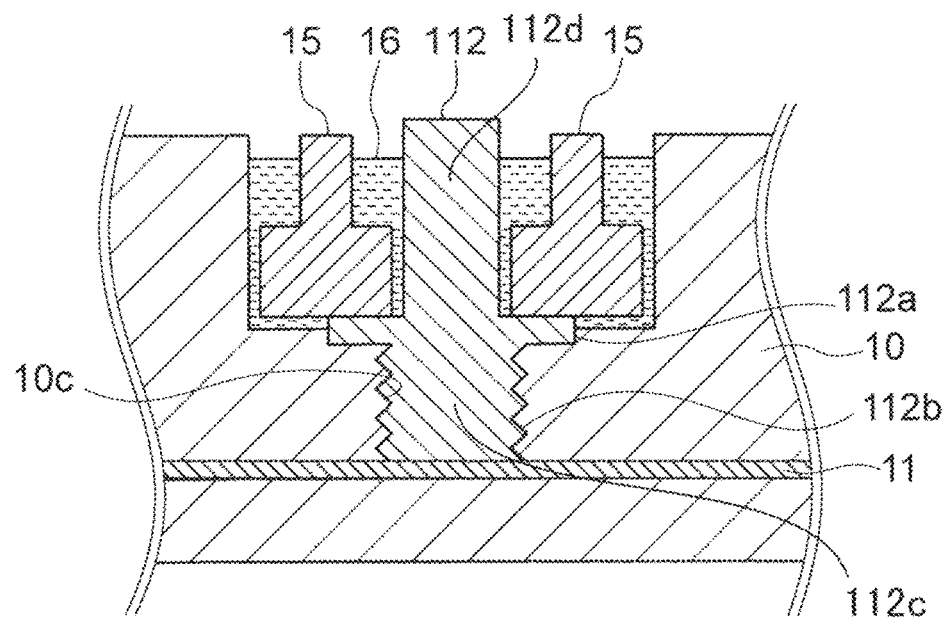
FIG. 4A is a partial cross section of a fourth specific example of a showered according to an embodiment.
Figure 4B:
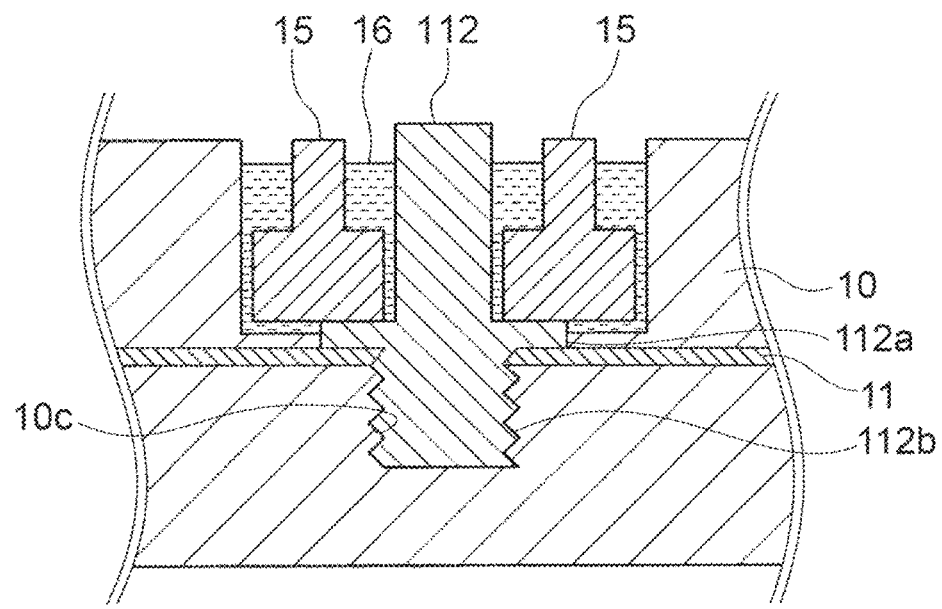
FIG. 4B is a partial cross section of a fifth specific example of a showered according to an embodiment.

A fourth specific example is shown in FIG. 4A. Referring to FIG. 4A, electrode terminal portion 112 made of tungsten has a base portion 112c and a columnar portion 112d provided on base portion 112c. Further, base portion 112c is provided with a flange portion 112a. Further, a male screw portion 112b is provided on a side closer to a tip than flange portion 112a. Further, disk-shaped member 10 is provided with a female screw portion 10c. Male screw portion 112b and female screw portion 10c may be screwed together. This can more reliably fix electrode terminal portion 112. Thus, when providing male screw portion 112b, a tip of male screw portion 112b may directly be connected to conductor 11, as shown to FIG. 4A. In a fifth specific example shown in FIG. 4B, conductor 11 may be provided with a through hole for male screw portion 112b so that an outer peripheral portion of flange portion 112a and a portion of conductor 11 surrounding the throughhole may be directly connected together.

Referring to FIGS. 2 to 5, a cylindrical member 15 having an inner diameter larger than an outer diameter of electrode terminal portions 12 and 112 by about 0.05 to 0.20 mm and an outer diameter smaller than an inner diameter of hole 10b by about 0.05 to 0.20 mm is fitted to electrode terminal portions 12 and 112. Cylindrical member 15 is suitably made of ceramic made of aluminum nitride. Flange portions 12a and 112a have an outer diameter smaller than that of cylindrical member 15. Accordingly, flange portions 12a and 112a have an upper surface covered with an inner peripheral portion of an end surface of one end portion of cylindrical member 15 on a side facing conductor 11. Hole 10b may have a simple shape having no step in the direction of the thickness of disk-shaped member 10, or, as shown in FIG. 2, hole 10b may have a bottom with a stepped portion 10d in conformity with flange portions 12a, 112a, annular member 14, and member 114 in the form of the hollowed conical frustum having an outer diameter smaller than the outer diameter of cylindrical member 15.

Even when stepped portion 10d is not provided or when stepped portion 10d is provided at the bottom of hole 10b, flange portions 12a and 112a have an upper portion slightly protruding from stepped portion 10d. Therefore, a gap G1 is formed between an outer peripheral portion of the end surface of one end portion of cylindrical member 15 on the side facing conductor 11 and the bottom of hole 10b or stepped portion 10d facing the outer peripheral portion. Further, a gap G2 is formed between an outer peripheral surface of the one end portion of cylindrical member 15 and an inner wall of hole 10b facing the outer peripheral surface. Further, a gap G3 is formed between an inner peripheral surface of the one end portion of cylindrical member 15 and an outer peripheral surface of electrode terminal portion 12, 112 facing the inner peripheral surface. A sealing member 16 suitably made of a glass material is introduced to fill these gaps G1 to G3.

Figure 5:
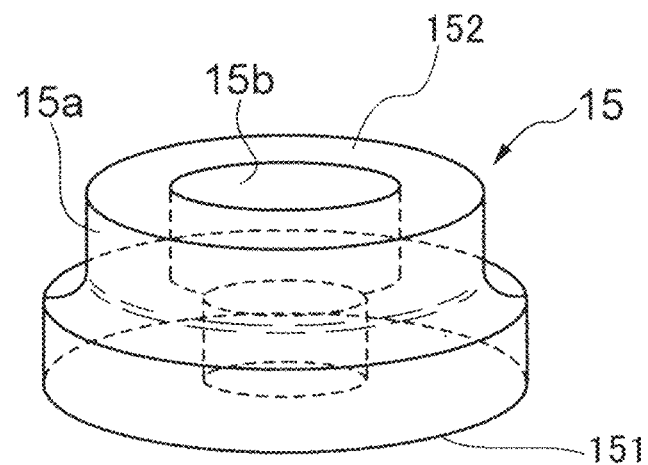
FIG. 5 is a schematic perspective view of a cylindrical member.

Cylindrical member 15, at the other end portion thereof facing away from the one end portion thereof facing conductor 11, has a diameter-reduced portion 15a having an outer peripheral surface with a reduced diameter and a diameter-increased portion 15b having an inner peripheral surface with an increased diameter, as shown in FIG. 5. From another point of view, cylindrical member 15 has a first end portion 151 fitted outside columnar portion 12c, 112d and facing conductor 11 and a second end portion 152 facing away from first end portion 151, second end portion 152's outer diameter being smaller than first end portion 151's outer diameter, second end portion 152's inner diameter being larger than first end portion 151's inner diameter. Thus, when cylindrical member 15 is fitted outside electrode terminal portion 12, an outer annular space S1 is formed between diameter-reduced portion 15a and an inner wall of hole 10b facing diameter-reduced portion 15a. Further, an inner annular space S2 is formed between diameter-increased portion 15b and an outer peripheral surface of electrode terminal portion 12, 112 facing diameter-increased portion 15b.

When sealing member 16 is used for sealing, glass heated and thus fluidized (or fused) can be pressed by cylindrical member 15 fitted outside electrode terminal portions 12 and 112 to satisfactorily fill gaps G1 to G3, for example, as will be described hereinafter. In doing so, pressing the glass until sealing member 16 protrudes from gaps G2 and G3 ensures that sealing member 16 spreads throughout gaps G1 to G3. Gap G2 is immediately adjacent to outer annular space S1. Gap G3 is immediately adjacent to outer annular space S2. Accordingly, sealing member 16 protruding from gap G2 and gap G3 is accommodated in outer annular space S1 and inner annular space S2. This can prevent sealing member 16 from protruding on a surface of disk-shaped member 10. Thus, such a problem as poor attachment is less likely to occur.

Further, causing sealing member 16 to protrude into outer annular space S1 and inner annular space S2 that are larger than gap G2 and gap G3 ensures that it can be visually confirmed that sealing member 16 has filled gaps G1 to G3 without a substantial gap. Thus, highly reliable showerhead 4 which is less likely to cause poor connection at an electrical connection portion between conductor 11 for an upper electrode and electrode terminal portion 12 for feeding the conductor with power even when the showerhead is used for a long time in a corrosive environment, can be manufactured without variation.

Hereinafter, a specific example of a method for manufacturing a showerhead will be described for showerhead 4 including disk-shaped member 10 having the sealing structure shown in FIG. 3A as a representative. A case where disk-shaped member 10 is composed of a ceramic material which is aluminum nitride will be described by way of example. Initially, 0.5 parts by mass of yttrium oxide as a sintering aid is added to 99.5 parts by mass of aluminum nitride powder and a binder and an organic solvent are further added thereto, and a ball mill is used to mix them together to prepare slurry. The slurry is sprayed in a spray dry method to prepare granules which are in turn press-formed to prepare two formed bodies. The formed bodies are degreased at 700° C. in a nitrogen atmosphere and then sintered at 1850° C. in a nitrogen atmosphere to provide two sintered aluminum nitride bodies.

These two sintered aluminum nitride bodies are each processed into the form of a disk of a prescribed size and subsequently, in order to form conductor 11, a W (tungsten) paste is applied to one side of one of the aluminum nitride bodies by screen-printing, and subsequently, degreasing is performed in a nitrogen atmosphere at 700° C. and thereafter firing is performed in a nitrogen atmosphere at 1830° C. An adhesive material containing aluminum nitride as a main component for adhesion is applied to one side of the other sintered body and subsequently, degreasing is performed.

These two sintered aluminum nitride bodies are joined and thus bonded such that conductor 11 is inside.

The thus formed, disk-shaped bonded body is machined or the like and thus perforated to have a plurality of gas discharging holes 10a having a predetermined inner diameter and arranged in a pattern as shown in FIG. 1 for example. Subsequently, hole 10b reaching conductor 11 is formed in the peripheral portion. Electrode terminal portion 12 made of W (tungsten) having flange portion 12a at an end portion thereof on a side of connection with conductor 11 is connected via connection portion 20 to conductor 11 partially exposed from the bottom of hole 10b. Connection portion 20 includes annular member 14 made of W (tungsten) and plate-shaped member 13. Connection portion 20 can be formed by fitting a previously annularly formed W (tungsten) member (annular member 14) to an outer peripheral surface of plate-shaped member 13. Thus, electrode terminal portion 12 is electrically connected to conductor 11 via annular conductive portion 14.

Subsequently, a glass preform formed in a doughnut shape for sealing is inserted in hole 1b at a bottom thereof around a portion at which electrode terminal portion 12 is connected. Then, cylindrical member 15 made of aluminum nitride as shown in FIG. 5 is fitted outside electrode terminal portion 12. In doing so, cylindrical member 15 is disposed so that an end portion thereof facing away from a side thereof having an outer peripheral surface with diameter-reduced portion 15a and an inner peripheral surface with diameter-increased portion 15b faces conductor 11. Subsequently, the above glass preform is fused, and until the fused glass protrudes into outer annular space S1 between diameter-reduced portion 15a and the inner wall surface of hole 10b facing diameter-reduced portion 15a and inner annular space S2 between diameter-increased portion 15b and the outer peripheral surface of electrode terminal portion 12 facing diameter-increased portion 15b, cylindrical member 15 is pressed toward conductor 11 to introduce sealing member 16. After the sealing member is introduced, it is left to be cooled and thus solidified. A showerhead can thus be manufactured.

It should be understood that the embodiments disclosed herein have been described for the purpose of illustration only and in a non-restrictive manner in any respect. The scope of the present invention is defined by the terms of the claims, rather than the description above, and is intended to include any modifications within the meaning and scope equivalent to the terms of the claims.

REFERENCE SIGNS LIST

1: semiconductor manufacturing apparatus
2: semiconductor wafer
3: chamber
4: showerhead
8: wafer holder
9: wafer carrying surface
10: disk-shaped member
10a: gas discharging hole
10b: hole
10c: female screw portion
10d: stepped portion
11: conductor
12, 112: electrode terminal portion
12a, 112a: flange portion
12b, 112b: base portion
12c, 112c: columnar portion
13: plate-shaped member 14: annular member
15: cylindrical member
151: first end portion
152: second end portion
15a: diameter-reduced portion
15b: diameter-increased portion
16: sealing member
20, 200: connection portion
112b: male screw portion
113: truncated conical member
114: member in the form of a hollowed conical frustum
G1, G2, G3: gap
S1: outer annular space
S2: inner annular space

The invention claimed is:

1. A showerhead provided in a chamber of a semiconductor manufacturing apparatus and facing a wafer holder, comprising: a disk-shaped member having a plurality of through holes penetrating the disk-shaped member in a direction of a thickness thereof; a high-frequency conductor embedded in the disk-shaped member; a hole provided in the disk-shaped member, extending in the direction of the thickness of the disk-shaped member and having a bottom exposing a portion of the conductor; an electrode terminal portion disposed in the hole and having a base portion electrically connected to the conductor and a columnar portion provided on the base portion; a cylindrical member having a first end portion fitted outside the columnar portion and facing the conductor and a second end portion facing away from the first end portion, the second end portion's outer diameter being smaller than the first end portion's outer diameter, the second end portion's inner diameter being larger than the first end portion's inner diameter; and a sealing member surrounding the first end portion.

2. The showerhead according to claim 1, further comprising a connection portion (Applicant's 20; FIG. 3A) that is disposed in the hole and electrically connects the conductor and the base portion.

3. The showerhead according to claim 1, wherein the base portion has a flange portion facing the conductor.

4. The showerhead according to claim 3, wherein the cylindrical member covers at least a portion of an upper surface of the flange portion by the first end portion.

5. The showerhead according to claim 2, wherein the connection portion includes a conductive annular member.

6. The showerhead according to claim 2, wherein the connection portion includes a conductive member in a form of a hollowed conical frustum increased in diameter in a direction from the conductor toward the base portion.

7. The showerhead according to claim 1, wherein the sealing member fills a gap formed between the cylindrical member and the electrode terminal portion and a gap formed between the cylindrical member and the hole.

8. The showerhead according to claim 1, wherein the cylindrical member is made of aluminum nitride, and the sealing member is made of glass.

9. A method for manufacturing a showerhead, comprising: forming a hole in a disk-shaped member, which has a high-frequency conductor embedded therein, in a direction of a thickness of the disk-shaped member to expose a portion of the conductor; connecting an electrode terminal portion to the conductor exposed at a bottom of the hole; fitting a glass preform in a form of a doughnut to the electrode terminal portion; fitting to the electrode terminal portion a cylindrical member having a first end portion facing the conductor and a second end portion facing away from the first end portion, the second end portion's outer diameter being smaller than the first end portion's outer diameter, the second end portion's inner diameter being larger than the first end portion's inner diameter; fusing the glass preform; pressing the cylindrical member toward the conductor until the fused glass preform protrudes into a gap between the second end portion's outer diameter and an inner wall of the hole and a gap between the diameter-increased portion and an outer peripheral surface of the electrode terminal portion; and solidifying the fused glass preform to seal the cylindrical member.

* * * * *